United States Patent [19]

Chang

[11] Patent Number: 5,645,963
[45] Date of Patent: Jul. 8, 1997

[54] METHOD FOR MAKING COLOR FILTER ELEMENTS USING LAMINABLE COLORED PHOTOSENSITIVE MATERIALS

[75] Inventor: Jeffrey C. Chang, North Oaks, Minn.

[73] Assignee: Minnesota Mining and Manufacturing Company, St. Paul, Minn.

[21] Appl. No.: 590,266

[22] Filed: Nov. 20, 1995

[51] Int. Cl.$^6$ .................................................. G03C 11/12
[52] U.S. Cl. ................... 430/7; 430/20; 430/25; 430/256
[58] Field of Search ................... 430/7, 203, 262, 430/200, 20, 25, 349, 210, 256

[56] References Cited

U.S. PATENT DOCUMENTS

| | | | |
|---|---|---|---|
| 3,671,236 | 6/1972 | Van Beusekom | 96/15 |
| 3,884,693 | 5/1975 | Bauer et al. | 96/15 |
| 4,260,673 | 4/1981 | Krech | 430/143 |
| 4,482,625 | 11/1984 | Namiki et al. | 430/143 |
| 4,571,374 | 2/1986 | Vikesland | 430/156 |
| 4,596,757 | 6/1986 | Barton et al. | 430/257 |
| 4,650,738 | 3/1987 | Platzer et al. | 430/143 |
| 4,656,114 | 4/1987 | Cederberg et al. | 430/160 |
| 4,659,642 | 4/1987 | Platzer et al. | 430/143 |
| 4,672,020 | 6/1987 | Koelsch et al. | 430/166 |
| 4,751,166 | 6/1988 | Platzer et al. | 430/160 |
| 4,756,988 | 7/1988 | Kausch et al. | 430/271 |
| 4,772,533 | 9/1988 | Platzer et al. | 430/166 |
| 4,808,508 | 2/1989 | Platzer | 430/143 |
| 4,877,697 | 10/1989 | Vollmann et al. | 430/20 |
| 4,929,532 | 5/1990 | Dunder | 430/143 |
| 4,948,693 | 8/1990 | Shadrach et al. | 430/143 |
| 4,988,168 | 1/1991 | Dickerson et al. | 350/339 F |
| 5,058,997 | 10/1991 | Dickerson et al. | 359/59 |
| 5,139,917 | 8/1992 | Hare | 430/138 |
| 5,185,055 | 2/1993 | Temple et al. | 156/630 |
| 5,213,941 | 5/1993 | Platzer | 430/143 |
| 5,236,801 | 8/1993 | Hare | 430/199 |
| 5,248,583 | 9/1993 | Lundquist et al. | 430/263 |
| 5,250,395 | 10/1993 | Allen et al. | 430/325 |
| 5,292,613 | 3/1994 | Sato et al. | 430/257 |
| 5,294,516 | 3/1994 | Sato et al. | 430/262 |
| 5,298,360 | 3/1994 | Sato et al. | 430/256 |
| 5,298,361 | 3/1994 | Bonham | 430/260 |
| 5,482,804 | 1/1996 | Itoh et al. | 430/7 |
| 5,494,774 | 2/1996 | Ali et al. | 430/200 |

FOREIGN PATENT DOCUMENTS

| | | |
|---|---|---|
| 621322 A1 | 4/1994 | European Pat. Off. . |
| 05127016 | 5/1993 | Japan . |

*Primary Examiner*—Thorl Chea
*Attorney, Agent, or Firm*—Arlene K. Musser

[57] ABSTRACT

Color filter elements are prepared by sequentially laminating, exposing and developing colored photoresist materials to form planar images on a transparent, non-birefringent substrate such as glass or polymeric film. Color filter elements are useful for elements in color displays such as liquid crystal display devices.

7 Claims, No Drawings

METHOD FOR MAKING COLOR FILTER ELEMENTS USING LAMINABLE COLORED PHOTOSENSITIVE MATERIALS

FIELD OF THE INVENTION

This invention relates to a color filter array and a process for preparing the color filter array using laminable photosensitive color elements, in particular, to a color filter array having multiple colored images in a single plane on a receptor for use in a liquid crystal display device.

BACKGROUND OF THE ART

Colored photoresist materials have been generally known in the art for many years. The most common use has been for color proofing applications. See, for example, U.S. Pat. Nos. 3,671,236; 4,596,757; 4,650,738; 4,656,114; 4,659,642; 4,751,166; 4,772,533; 4,808,508; 4,929,532; 4,948,693; and 5,248,583 (each describe a photosensitive color element comprising a permanent adhesive layer); U.S. Pat. No. 5,213,941 (describes a photosensitive color element comprising a partially developable adhesive layer); U.S. Pat. No. 3,884,693 (describes a photosensitive color layer on a releasable carrier); U.S. Pat. Nos. 4,260,673; and 4,482,625 (describe a photosensitive color layer on a releasable carrier and process of transferring the aqueous developed image onto a photopolymerizable receiving layer); European Application 621322 A1 (describes an aqueous developable macromolecular dye photoresist comprising a carrier and colored photoresist layer) and U.S. Patent Nos. 4,571,374; 4,672,020; 4,756,988 (describe a photoresist which may contain a colorant and an adjacent developable adhesive layer.).

The use of colored photoresist materials for the preparation of color filter arrays are also known. In U.S. Pat. No. 4,877,697, the preparation of a color filter array is described using color proofing films. Either a positive or a negative acting photoresist comprising a temporary support, an oxygen barrier or release layer, a colored photoresist layer and a permanent adhesive layer is laminated to a substrate and the temporary carrier removed. The photoresist is imagewise exposed with actinic radiation and then developed with an alkali developer leaving behind the image and the adhesive layer. The process is then repeated for each of the desired colors. Since the adhesive layer is a permanent part of the construction, the colored images are separated by interposing adhesive layers. The adhesive layers cause the different colored images to be on different planes and increase the thickness of the overall construction, often exceeding 10 microns in thickness. For optimal performance in a LCD color filter, it is desirable for the different colored images to lie in the same plane or at least within a thickness of 3 microns. The presence of the clear adhesive layers and color layers on different planes farther away from the black matrix can lead to unwanted leakage of projection light and cause optical distortions of the image. In addition, entrapment of air during the lamination process can cause unwanted voids or pinholes and inadequate adhesion of the color elements to the substrate.

The preparation of color filter arrays using photoresists that do not contain a permanent adhesive layer are also known. For example, in U.S. Pat. No. 4,777,117, the preparation of a color filter array is described using either a positive or negative acting photoresist and a special photomask with a registration mark. In U.S. Pat. No. 5,292,613, a process is disclosed for preparing a color filter array on glass using an article comprising a temporary support, a thermoplastic layer, an optional oxygen impermeable layer and a light sensitive layer. The image is formed by laminating the light sensitive layer to the substrate, removing the support and the thermoplastic layer, exposing with actinic radiation, and developing the image with a developer solution. A similar construction is described in U.S. Pat. No. 5,294,516; except the thermoplastic layer in this construction is alkali soluble and remains with the photosensitive layer when transferred to a substrate. The absence of an adhesive in these type of constructions cause poor transfer or adhesion of the image when dust, entrapped air or other surface irregularities are present.

In JP 05127016 A, a process for producing a color filter array is described using a dry peel apart development process. A photosensitive color element comprising a temporary support and a photosensitive color layer is laminated to a transparent substrate, imagewise exposed to actinic radiation and developed by peeling apart the construction. The image resolution of systems of this type are typically not as good as solvent or aqueous developed systems.

Even though it is highly desirable to eliminate the adhesive layer in colored photoresist materials for use in color filter array applications, a concern for contamination of the colored images arises due to the migration of materials during the lamination and development process steps of subsequent colors.

SUMMARY OF THE INVENTION

This invention provides a color filter array having multiple colored images in a single plane and a method for preparing the color filter array using laminable photosensitive color elements comprising, in the following order: a temporary releaseable support, a colored photoresist layer and an optional photo-imageable adhesive layer. The optional photo-imageable adhesive layer not only allows the images to be formed in a single plane, but may also provide better adhesion of the images to the receptor. In a preferred embodiment, a release layer is interposed between the temporary support and the colored photoresist layer.

In one embodiment, a color filter array is provided having, in the following order: multiple colored images deposited in a single plane, wherein each of the colored images comprises a colored layer and an adhesive layer; a microporous crosslinked silicated coating; and a transparent substrate.

In another embodiment, a color filter array having multiple colored images in a single plane is formed by the following steps: (i) providing a receptor comprising a transparent substrate having deposited on the top surface a microporous crosslinked silicated coating; and a plurality of laminable photosensitive color elements having different colors, comprising, in order: a temporary releaseable support, a colored photoresist layer and an optional photo-imageable adhesive layer; (ii) laminating one of the laminable photosensitive color elements onto the top surface of the receptor to form a laminate structure; (iii) removing the temporary support from the laminate structure; (iv) exposing the colored photoresist layer and the optional photo-imageable adhesive layer in an imagewise pattern; (v) removing the non-exposed areas of the colored photoresist and non-exposed areas of the optional photo-imageable adhesive layer with a developer solution to form an image; (vi) repeating steps (ii), (iii), (iv) and (v) with another one of the laminate photosensitive color elements having a different color until all of the multiple colored images are formed on the receptor. The final color filter composite is subsequently associated (e.g., overlay, bonding, framing, etc.) with a liquid crystal display device. In a preferred embodiment, heat and pressure is applied to the laminate structure a second time after step (iii) and before step (iv).

In an alternative embodiment, a color filter composite having multiple colored images in a single plane is formed within a black matrix by the steps of: (i) providing a receptor comprising a transparent substrate having deposited on the top surface a black matrix image and a microporous crosslinked silicated coating interposed between the substrate and the black matrix image; and multiple laminable photosensitive color elements having different colors comprising, in order; a temporary releasable support, a colored photoresist layer and an optional photo-imageable adhesive layer; (ii) laminating one of the photosensitive color elements onto the top surface of the receptor to form a laminated structure; (iii) removing the temporary support from the laminated structure; (iv) exposing the colored photoresist layer and the optional photo-imageable adhesive layer in an imagewise pattern; (v) removing the non-exposed areas of the colored photoresist layer and non-exposed areas of the optional photo-imageable adhesive layer with a developer solution to form an image; (vi) repeating steps (ii), (iii), (iv) and (v) with another one of the laminable photosensitive color elements having a different color until all of the multiple colored images are formed on the receptor. The color filter composite is subsequently associated (e.g., overlay, bonding, framing, etc.) with a liquid crystal display device. In a preferred embodiment, heat and pressure is applied to the laminate structure a second time after step (iii) and before step (iv).

DETAILED DESCRIPTION

The color filter array of this invention provides multiple colored images in a single plane deposited upon a transparent substrate. The transparent substrate can be flexible (i.e., polymeric film), or rigid (i.e., glass) and may be treated with a microporous crosslinked silicated coating to assist adhesion of the image to the substrate. The optical transmission characteristics of the elements in the display are controlled by electronic addressing of the liquid crystal cells. Color patterns are obtained by aligning the color filter array with the liquid crystal array and the light source.

The color filter array having multiple colored images on a single plane is formed by sequential lamination, exposure to actinic radiation and development of multiple different colored photosensitive color elements on the surface of a transparent substrate and subsequent association (e.g., overlay, bonding, framing, etc.) with a liquid crystal display device. The transparent substrate can be flexible (i.e., polymeric film), or rigid (i.e., glass) and may be treated with a microporous crosslinked silicated coating to promote the adhesion of the image on the substrate. Upon electrical addressing of a liquid crystal element overlaying the patterns of color images in the filter, light corresponding to the colors in the patterns is allowed to pass through the selected areas of the display to provide a visual signal.

Alternatively, a black matrix may be provided on one surface of the transparent substrate and a color filter array having multiple colored images in a single plane is formed within that matrix by sequential lamination, exposure to actinic radiation and development of multiple different colored photosensitive color elements within the window areas of the matrix. The transparent substrate may be treated with a microporous crosslinked silicated coating prior to the application of the black matrix to promote the adhesion of the black matrix and subsequent colored images formed on the substrate. The colored images are produced successively in registration to the window areas of the matrix by laminating, exposing the colored photoresist layer and the adjacent photo-imageable adhesive layer using a photomask representing the desired pattern and developing the image. The liquid crystal filtering device is then associated with the color filter created. The color filter provides specific images which are desired to be displayed, including graphics designs such as squares, rectangles, triangles, arrows, stars, diamonds, etc. Upon electrical addressing of a liquid crystal element overlaying the patterns of color images in the filter, light corresponding to the colors in the patterns is allowed to pass through the selected areas of the display to provide a visual signal.

For a color filter array to be useful as a component of certain types of liquid crystal displays, the color filter array is preferably coated with a planarizing layer. This is usually followed by a coating of a transparent conductor, commonly indium tin oxide (ITO). The conductive layer may or may not be patterned. Finally, an alignment layer, typically a polyamide, is applied onto the conductive layer. The alignment layer is typically patterned (e.g., by brushing) to control the alignment of the liquid crystal material in the functioning display.

A matrix is simply an outline or frame or dividing grid of lines which define open areas or windows through which visible light may pass. When a matrix is used in the practice of the present invention, it may be formed by any convenient method available. For example, a black matrix may be formed by lithographic etching of a black substrate, wherein a solid black surface is etched away to leave a pattern of window frames within which the colorant can be deposited. It is also possible to lay down a photoresist, etch the pattern of the matrix into the photoresist, and deposit black material into the etched areas to form the matrix windows. A preferred method, disclosed in co-pending U.S. patent application Ser. No. 08/273,419 is to transparentize a black metal surface by laser induced thermal imaging techniques to leave the matrix. It would be equally useful to form the matrix by laser induced thermal transfer of a black coating layer or composition onto the carrier surface in the form of a matrix of windows.

The transparent substrate may be any substance upon which a color filter or the like is desired to be formed. Preferably the substrate is a transparent (at least light transmissive) substrate, such as glass, polymer film, and the like. Suitable substrates include glass, polyester base (e.g., polyethylene terephthalate, polyethylene naphthalate), polycarbonate resins, polyolefin resins, polyvinyl resins (e.g., polyvinyl chloride, polyvinylidene chloride, polyvinyl acetals, etc.), cellulose ester bases (e.g., cellulose triacetate, cellulose acetate), and other conventional polymeric films used as supports in various imaging arts. Transparent polymeric film base of 10 micrometers to 5 millimeters is preferred. If the substrate is a polymeric film, it is preferred that the film be non-birefringent so as not to interfere with the operation of the display in which it is to be integrated. When polymeric films are chosen as the substrate, it is sometimes desirable to have a priming layer on the substrate to maximize lamination and adhesion of the photosensitive color element to the substrate. Suitable primers include gelatins, polyvinylidene chloride copolymers, azifidines, acrylates and melamine-formaldehyde. The coating weight of the primer is typically present in the range of 0.05 to 5 $g/m^2$, preferably 0.1 to 2 $g/m^2$. Preferred examples of non-birefringent substrates are polyesters that are solvent cast. Typical examples of these are those derived from polymers consisting or consisting essentially of repeating, interpolymerized units derived from 9,9-bis-(4-hydroxyphenyl)-fluorene and isophthalic acid, terephthalic acid or mixtures thereof, the polymer being sufficiently low in oligomer (i.e., chemical species having molecular weights of about 8000 or less) content to allow formation of a uniform film. This polymer has been disclosed as one component in a thermal transfer receiving element in U.S. Pat. No. 5,318,938. Another class of non-birefringent substrates are amorphous polyolefins (e.g., Zeonex™ from Nippon Zeon Co., Ltd.). The most preferred substrate is glass. It is preferred that this glass be 0.5 to 2.0 mm thick. Especially preferred thicknesses are 0.7 and 1.1 mm.

The transparent substrate may be optionally treated with a microporous crosslinked silicated coating to increase adhesion of the colored image. This is particularly desirable when glass is used for the substrate. The microporous surface may be composed of silica particles, preferably of less than about 500 nm, crosslinked by a coupling agent and adhered strongly to the substrate. The preferred microporous crosslinked silicated surface is prepared by coating an aqueous solution containing a colloidal silica sol and an ambifunctional silane coupling agent on the polymeric surface of the substrate sheet, which is to be used as the color filter array. The colloidal silicas are different from silica powders in that they are discrete, non-agglomerated and uniformly dispersed in a liquid medium. The surface of the colloidal particle has silanol groups which are partially ionized. The partially ionized particle is stabilized by a counter ion in a dispersion. Suitable silica sols include sodium, potassium, and ammonium stabilized colloidal silica dispersions, such as Nalco™ 2326 available from Nalco Chemical, Chicago, Ill. A preferred mean particle size is about 2 nm to 100 nm, and more preferably about 4 nm to 50 nm.

Suitable coupling agents are compounds with at least two different reactive groups, each group being capable of reacting with another species. Such materials include ambifunctional titantes and silanes, for example, particularly ambifunctional silanes which have reactive silanes on one end of the molecule and a different species capable of chemical bonding with the substrate or a coated primer on the substrate. The ambifunctional silanes can be represented by the following formula:

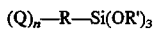

where R' is alkyl or aryl; R is an organic group with (n+1) external bonds or valences; n is 0, 1, or 2: and Q is a moiety capable of bonding with the substrate or a coated primer on the substrate. The silane reacts with silanol groups of the colloidal silica particles and forms a crosslinked network when dried at elevated temperature.

Preferably R' is an alkyl group having 1 to 10 carbon atoms, and more preferably 1 to 4 carbon atoms. R is preferably an aliphatic or aromatic bridging group such as alkylene, arylene, or alkarylene which may be interrupted with ether linkages, nitrogen linkages, or other relatively inert moieties. Preferably R is an alkylene group having 1 to 12 carbon atoms, more preferably 2 to 6 carbon atoms, with n equal to 1. Q is preferably epoxy (e.g., glycidyl), or amino, either primary or secondary, more preferably primary amino.

The ratio of the colloidal silica to the coupler in the coating solution is generally from 15:1 to 4:1 by weight, depending on which silica and coupler are used. For example when Nalco™ 2326 colloidal silica with a mean particle size of 5 nm and pH of 9.0 is to be crosslinked with 3-aminopropyl triethoxysilane, the useful ratio is between 12.5:1 to 5:1 by weight. The coating solutions can include other materials such as coating aids, surfactants, binders, etc., in amounts sufficient to improve coating quality yet not adversely affect the desired hydrophilicity. These additives can be added in amounts in the range of about 0.01% to 5% by weight of the colloidal silica. The resulting solutions are coated by methods known in the art and dried, for example at 100° to 120° C. to yield a dry coating weight of about 0.1 to 2 g/m², preferably about 0.3 to 1.2 g/m².

The basic technology of crosslinking colloidal silicas by a silane coupling agent to form a primed surface for adhesive coating and photographic film applications is disclosed in U.S. Pat. No. 5,204,219. In addition, the use of microporous hydrophilic crosslinked silicated coatings on receptor surfaces in making direct lithographic printing plates using thermal transfer imaging is disclosed in co-pending Ali et al, U.S. patent application Ser. Nos. 08/320,943 and 08/419,046. In the present invention, the incorporation of a microporous hydrophilic crosslinked silicated surface provides an excellent receptor for the photo-imageable adhesive of the photosensitive color element. During the thermal lamination process, the microporous surface, through intimate contact and capillary action, effectively receives the melted or softened adhesive layer from the photosensitive color element and anchors the adhesive coating to the silicated coating interpores.

The laminable photosensitive color element used in the present invention comprises, in order; a temporary releasable support, a colored photoresist layer and an optional photo-imageable adhesive layer.

The temporary support is typically a polyester film. However, any film that has sufficient transparency at the imaging wavelength and sufficient mechanical stability can be used. Suitable thicknesses of the temporary support are 3 to 200 microns, preferably 3 to 150 microns and more preferably 10 to 100 microns. The temporary support must have a release surface whose function is to serve as a parting layer between the temporary support and the colored photoresist layer. In a preferred embodiment, the release properties are provided by including a release layer interposed between the temporary support and the colored photoresist layer. The release layer releases from the temporary support and clings to the colored photoresist layer after lamination to a substrate and subsequent removal of the temporary support. If the colored photoresist layer is sensitive to oxygen quenching during the exposure process, then the release layer may additionally act as an oxygen barrier. The release layer may also provide protection for the colored photoresist layer after removal of the temporary support. The release layer is coated onto the temporary support using an aqueous solution of water soluble resins. Preferred water soluble resins non-exclusively include alkyl ethers of cellulose, polyvinyl alcohols and polyvinyl pyrrolidone. Suitable coating thicknesses of the release layer are from 0.2 to 15 microns, preferably from 0.5 to 10 microns. The release properties of the layer can be controlled by the incorporation of a water soluble surfactant. Preferred surfactants non-exclusively include alkylarylpolyether alcohols, glycerin and ethoxylated castor oil. In the preferred embodiment, the surfactant is present in the release layer in the amount of 0.1–5.0 % by weight of solids in the layer, more preferably 0.5–2.0%. Other ingredients may be added such as mold inhibitors, anti-halation dyes, filter dyes, solvents, wetting agents, anti-static materials, anti-blocking aides, etc.

Adjacent to the releaseable surface is coated a colored photoresist layer which typically comprises photopolymerizable materials, a photoinitiator system, at least one organic or inorganic colorant, such as a pigment or dye, and an optional organic polymer or binder. The color layer may also contain a variety of additives including but not limited to spectral sensitizing dyes, plasticizers, wetting agents, coating rheology modifiers, UV-stabilizers, film forming additives, and adhesion promoters. When a spectral sensitizing dye is used as an additive, it is generally preferable that the dye absorbs light of the same frequency as the imaging light source. The colored photoresist layer is coated onto the releasable surface of the temporary support using a solvent system which gives rise to the best coating quality and solution stability. Representative solvents include ketones, alkyl ethers or acetates of propylene glycol, alkyl ethers or acetates of ethylene glycol, dioxolane, butyrolactone, cyclohexanone, alcohols, and mixtures thereof. The colored photoresist layer preferably possesses thermoplastic properties and is nontacky at room temperature. When a photo-imageable adhesive layer is not included in the construction, it is also highly desirable that the colored photoresist become softened or tacky at temperatures between about 35° C. and 150° C.

The photopolymerizable materials used in the colored photoresist layer may include monomers, oligomers, prepolymers, thermoplastic crosslinkable photopolymers, or any combination thereof. Suitable photopolymerizable oligomers or prepolymers include multi-functional acrylates whose function is to form a high molecular weight polymer upon initiation by light generated radicals. The molecular weight and the Tg of the acrylated oligomer influence several performance characteristics of the final coated film such as the tack of the coated film, adhesion to the receptor, the strength of the developer necessary to develop the image and the quality of the image attained. If the film imparts too much tack then it is difficult to manufacture the material in a production coating process without causing unwanted transfer of the coating onto face-side rollers and idlers. The strength of the developer required to develop the image is directly proportional to the molecular weight of the oligomer and the acid content of the oligomer. Oligomers with lower molecular weights and high acid content are easier to develop and therefore do not need very aggressive developers. However, too much acid content or too high a molecular weight can cause destabilization of the pigment dispersions when acidic binders are used to disperse the pigments. The choice of oligomer also influences the dimensional stability and heat stability of the final image. Ethylenically unsaturated groups are attached to the monomers, oligomers, or polymers to increase crosslink density. Examples of suitable ethylenically unsaturated polymerizable groups include acryloyl, methacryloyl and acrylamido groups. Suitable polymers, oligomers or monomers are well known in the art and non-exclusively include materials such as novolac acrylate resins (i.e., Echo™ 310, available from Echo Resins and Laboratory, Versailles, Mo.), (meth) acrylate esters of polyols, (i.e., 1,3-butanediol diacrylate, tetramethylene glycol diacrylate, propylene glycol diacrylate, polybutane diol diacrylate, dipentaerythritol pentaacrylate, pentaerythritol tetraacrylate and triacrylate, pentaerythritol tetramethacrylate and trimethacrylate, hydantoin hexaacrylate, and tetrahydrofurfurylmethacrylate), (meth)acrylated urethane oligomers (i.e., Ebecryl™220, hexaacrylate urethane oligomer, available from UCB Radcure Inc., Louisville, Ky.), acrylamides (i.e., diacetone acrylamide and acrylamidoethyl methacrylate), methacrylated styrene/maleic partial-ester copolymers (i.e., Sarbox™ 401 and PRO™ 884 available from Sartomer Co. Inc., Exton, Pa.), acrylated urethane oligomers (described in U.S. Pat. No. 4,304,923), (meth) acrylated sulfocompound oligomers (described in U.S. Pat. No. 4,855,384) and (meth)acrylated azlactone derivatives (described in U.S. Pat. No. 5,235,015). The composition of the polymer, oligomer or monomer backbone is not critical as long as it does not impart visible color shifts (less than 1 delta E measured spectrophotometrically with a Gretag SPM spectrophotometer) in the photosensitive color layer during the imaging process or upon natural aging (90 days at ambient temperature).

In the preferred embodiment, the photoinitiator(s) used must not generate a visible color change in the image or adhesive layers after exposure. Examples of photoinitiators non-exclusively include; triazines, acetophenones, benzophenones, and thioxanthones. The preferred photoinitiators include Irgacure™ 907 (2-methyl-1-(4-(methylthio) phenyl)-2-(4-morpholinyl)-1-propane) available from Ciba Geigy Corp., Hawthorne, N.Y.), Irgacure™ 369 (2-benzyl-2-(dimethylamine)-1-4-(r-morpholinylphenyl)-1-butanone, available from Ciba Geigy Corp., Hawthorne, N.Y.), Speedcure™ ITX (isopropylthioxanthone, available from Aceto Chemical Co. Inc., Flushing, N.Y.) and triazines tethered to alkylarylpolyether alcohols as described in U.S. Pat. No. 5,298,361. The initiators may be used singly or in combination with each other. The optimum amount of initiator will be dependent upon the oligomer type used and the filtering effect of the pigment used; however, the initiator is usually present in concentrations of about 1.0–10% by weight of the photosensitive composition.

The colors of the photoresist may be selected as needed by the user from amongst the many available colorants (i.e., pigments, dyes or polymeric dyes) normally used in filter elements, such as cyan, yellow, magenta, red, blue, green, white and other colors and tones of the spectrum as contemplated. When a pigment is used, it is highly desirable for the pigment to be dispersed uniformly throughout the photosensitive resin. The particle size of the pigment dispersion is preferably less than 1 micron and more preferably less than the wavelength of light (i.e., submicron range).

Any combination of pigments or dyes may be used in the color layer, but preferred are those listed as having good color permanency and transparency in the *NPIRI Raw Materials Data Handbook*, Volume 4 (Pigments). The pigments are generally introduced into the color formulation in the form of a millbase comprising the pigment dispersed with a binder and suspended into a solvent or mixture of solvents. The pigment type and color are chosen such that the coated colored element is matched to a preset color target or specification set by the industry. Either non-aqueous or aqueous dispersions of pigment in binder may be used. The use of appropriate binders promotes the formation of sharp, well defined lines during development. The type of dispersing resin and the pigment to resin composition ratio chosen are dependent upon the pigment type, surface treatment on the pigment, dispersing solvent and milling process. Examples of resins suitable for generating millbases which are compatible with the aforementioned photo-oligomers non-exclusively include; polyvinyl acetate/crotonic acid copolymers, styrene maleic anhydride half ester resins, (meth)acrylic polymers and copolymers, polyvinyl acetals, polyvinyl acetals modified with anhydrides and amines, hydroxy alkyl cellulose resins and styrene acrylic resins. The primary composition of the dispersing resin is an acidic resin however, some non-acidic resins may be present. In some combinations, a dispersing agent may be necessary to achieve optimum dispersion quality. Suitable dispersing agents non-exclusively include; polyester/polyamine copolymers, Disperse Aids™ (available from Daniels), PKE 1370 polyester resin (available from Biddie Sawyer), alkylarylpolyether alcohols, and acrylic resins. Other components may also be included in the millbase such as surfactants, to improve solution stability, UV absorbers, fillers, etc. The preferred composition of the millbase solids comprises 30–71% by weight pigment, 15–30% by weight acidic resin, 0–25% non-acidic resin, 0–20%, more preferably 0–10% dispersing agents.

Additional binders may also be included in the colored photoresist formulation to balance developability and tack. Some examples of additional binders which are compatible with the aforementioned photo-oligomers and millbases non.-exclusively include; polyvinyl acetate/crotonic acid copolymers, styrene maleic anhydride half ester resins, (meth)acrylic polymers and copolymers, alkyl or alkylaryl (meth)acrylate polymers and copolymers, polyvinyl acetals, polyvinyl acetals modified with anhydrides and amines, and styrene acrylic resins. The binder resin preferably contains an acid functionality such as a carboxylic group to assist developability in aqueous developers. In the preferred composition of the colored photoresist layer, the pigment is present in the amount of 5–60% by weight, the acidic resin in the amount of 10–20% by weight and non-acidic resin in the amount of 0–20% by weight.

Coated adjacent to the colored photoresist layer is an optional photo-imageable adhesive layer. In some constructions it may be desirable to include a photo-imageable adhesive layer to prevent interaction between the colored image and subsequent colored photoresist elements laminated on top of the image. The adhesive layer may also provide better adhesion of the colored photoresist layer to the receptor. A typical photo-imageable adhesive layer comprises a colorless photopolymerizable material(s) and a photoinitiator. The performance requirements (i.e., imageability and developability) of the adhesive layer are similar to the colored photoresist layer except that the adhesive layer must provide sufficient adhesion to a receptor when thermally laminated to a either a primed or unprimed surface of the receptor. Suitable photopolymerizable materials include those discussed previously for use in the colored photoresist layer. The preferred photopolymerizable materials are those capable of being laminated to a receptor under heat and pressure. The adhesive layer is preferably non-tacky at room temperature and laminable between 35° C. to 150° C. The adhesive layer may be coated from a solution using any known coating methods (i.e., wire wound bar, extrusion, reverse roll, curtain coating, etc.). Interactions between the adhesive layer and colored photoresist layer should be minimized during the coating process to prevent damage to the color layer. Therefore, it is preferred to use solvents such as water or alcohols to minimize interaction with the color layer. Preferred photopolymerizable materials include oligomers based on (meth)acrylated azlactone derivatives (such as those described in U.S. Pat. No. 5,235,015), acrylated urethane oligomers (such as those described in U.S. Pat. No. 4,304,923) and urethane prepolymers; which can provide tack-free coatings prior to radiation curing during the imaging process. The thickness of the adhesive layer is preferably 0.2 to 3 microns and more preferably 0.5 to 1.5 microns.

The photosensitive color element is laminated to the receptor using a thermal laminator, preferably a vacuum assisted thermal laminator (i.e., Matchprint™ 1147 laminator, available from 3M, St. Paul, Minn.) The silicated surface of the transparent substrate and the photo-imageable adhesive layer are laminated together by first pulling a vacuum of approximately 0.1 psi between the two surfaces immediately prior to contact lamination. The vacuum assists in eliminating entrapped air during the lamination process. The lamination is accomplished with both heat and pressure. Typical lamination temperatures are between 50° C. and 150° C. and pressures between 10 and 50 pounds-per-inch (psi). Once the first photosensitive color element is laminated to the transparent substrate the temporary support is removed and a photomask representing the color image desired is placed in intimate contact with the colored photoresist under vacuum. The laminate structure is then exposed with ultraviolet (UV) light and developed with a developer solution. Suitable light sources include mercury, xenon, carbon arc and tungsten filament lamps, lasers, etc. Typical exposure times are between about 1 microsecond to 15 minutes, depending upon the light source used and the photopolymerizable composition of the color photoresist and adhesive layers.

In the practice of the present invention, it has been found to be beneficial to apply heat and pressure to the laminate structure a second time after removal of the temporary support and before exposure. Due to the presence of the temporary support during the first lamination, the heat transfer efficiency is reduced which may lead to inadequate contact between the laminating surfaces. By laminating the laminate structure a second time after removal of the temporary support, the efficiency of heat transfer is increased which provides more uniform and complete contact between the surfaces of the receptor and photosensitive color element. The quality of the lamination becomes more difficult when subsequent photosensitive color elements are laminated onto a receptor having previously developed images present. In this situation, the subsequent color element is laminated over a relief image. The probability of entrapped air is increased due to the presence of the relief image. However, improved encapsulation of the relief image may be accomplished by performing a second lamination after the temporary support is removed.

Suitable developer solutions used to develop the image after exposure are typically comprised of a combination of Sodium or Potassium carbonate, and Sodium or Potassium bicarbonate and a surfactant. In some cases bicarbonate alone is sufficient. Suitable surfactants include; Surfynol™ 465 (available from air Products), Surfactol™ 365 (available from CasChem), Triton X-100 (available from Rohm and Haas), and Surfynol™ GA (available from Air Products).

Subsequent images are formed on the receptor containing the first image by the same process using photosensitive color elements having a different colors. Each different colored element is sequentially laminated, exposed and developed until all the desired colored images are present on the receptor. It is sometimes desirable to laminate the composite a second time prior to exposing. The additional lamination step may be accomplished either prior to or after removal of the temporary support. It is preferred to remove the temporary support prior to the additional lamination step. The additional lamination step insures intimate contact with the receptor surface, especially when laminating additional colored elements to a receptor having images present on the receptor surface.

A general description of color filters for liquid crystal displays is given in C.C. O Mara, *Liquid Crystal Flat Panel Display: Manufacturing Science and Technology*, Van Norstrand Reinhold, 1993 p. 70. Several fabrication methods are disclosed. The most common method for preparing color filters is using photolithographic techniques. One photolithographic process is detailed in an article entitled "Color Filters from Dyed Polyimides" W. J. Latham and D. W. Hawley, Solid State Technology, May 1988. This paper shows the complex, multi-step nature of the photolithographic process. By comparison, this invention provides a much simpler process for making a color filter array.

The shapes of the color elements may be simple geometric objects such as rectangles, squares or triangles. Alternatively, for some configurations of color filters, the color elements may be created as stripes. Another common configuration for a color filter array is when the color elements in one row are displaced by one element in the second row and by two elements in the third row such that the color elements are diagonally aligned.

The dimensions of the elements can range from 5–1000 microns. More typically the dimensions are on the order of 30–300 microns. These dimensions are easily produced by photolithographic and laser imaging techniques.

The colors used to form the color filter are generally the primary additive colors, i.e. red, green, and blue. Each of these primary colors preferably has high color purity and transmittance, and, when combined, an appropriate white balance. The color filters preferably have spectral characteristics of red, green, and blue that show chromaticity close to the National Television Standards Committee (NTSC) standard colors indicated by the Commission International de l'Eclairage (CIE) chromaticity diagram. Although red, green, and blue are the most common colors for the filters, other color combinations may be used for specialty applications. In some cases, the repeat sequence in a row is red:green:blue. For other applications the repeat sequence in a row is red:green:green:blue.

These and other aspects of the present invention can be seen in the following, non-limiting examples of the present invention.

EXAMPLES

Unless designated otherwise, all materials are available from Aldrich Chemicals, Milwaukee, Wis.

The lamination steps in the following examples were performed in a Matchprint™ 1147 laminator (available from 3M, St. Paul, Minn.) set at the following conditions: transport speed of 2.0 m/min., top roll temperature of 280° F.

The following materials and coating solutions were used in the following Examples.

Preparation of p-Most-ol photoinitiator:

The following preparation of 2,4-bis(trichloromethyl)-6-[4-(2-hydroxyethoxy)styryl]-1,3,5-triazine, herein after referred to a p-MOST-ol, is described in U.S. Pat. No. 5,298,361 (Preparation I). A stirred solution of 2,4-bis (trichloromethyl)-6-methyl-1,3,5-triazine (90 g, 0.27 mole), 4-(2-hydroxyethoxy)-benzaldehyde (50 g, 0.30 mole), and ammonium acetate (12 g) in 220 mL of methanol was refluxed for 7 hours. After the mixture was allowed to cool, the product that crystallized from the reaction solution was filtered, washed with cold methanol, and dried to yield 100 g of p-MOST-ol, mp 173°–177° C. The product was further purified by recrystallization in toluene.

Preparation of Methacrylate Photopolymerizable Polymer:

The preparation of the methacrylate photopolymerizable polymer is described in Example 4 of Ali, et al., U.S. Pat. No. 5,235,015. A 95:5 weight % copolymer of VDM (2-vinyl-4,4-dimethyl-2-oxazoline-5-one) and (2-methacryloxyethyl)-1-hexadecyldimethylammonium bromide (DMAEMA-$C_{16}$) was functionalized by reacting with 0.7 equivalents of 2-hydroxyethylmethacrylate (HEMA), 0.1 equivalent of aspartic acid monotetrabutylammonium salt (ASATBA) and 0.2 equivalents of water, all equivalents with respect to VDM.

| Release Layer Coating Solution: | |
|---|---|
| Airvol ™ 205 Polyvinyl alcohol (available from Air Products and Chemicals, Allentown, PA) | 5.6 g |
| Airvol ™ 107 Polyvinyl alcohol (available from Air Products and Chemicals, Allentown, PA) | 2.4 g |
| Triton ™ X-100 (octylphenoxypolyethoxyethanol, available from Rohm and Haas, Philadelphia, PA) | 0.2 g |
| Kathon ™ CG/ICP Preservative (available from Rohm and Haas, Philadelphia, PA) | 0.09 g |
| Deionized Water | 91.7 g |

Preparation of Receptors having a crosslinked silicated surface:

A microporous silicated coating solution was prepared by combining 1.25% by weight Nalco™ 2326 colloidal silica (ammonium stabilized colloidal silica with a mean particle size of 5 nm, available from Nalco Chemical, Chicago, Ill.), 0.113% by weight 3-aminopropyl triethoxy silane, and 0.03% by weight Triton™ X-100 (octylphenoxy ethanol, available from Rohm & Haas, Philadelphia, Pa.) in water.

A polyester receptor was prepared by coating the silicated coating solution onto a 4 mil (0.10 mm) PVdC (polyvinylidone chloride) primed polyester substrate using a #12 wire wound bar. The coating was dried at 110° C. for 2 minute resulting in a highly crosslinked silicate surface with submicron thickness.

A glass receptor was prepared by coating the silicated coating solution onto a 75×50×1 mm precleaned glass slide (available from Fisher Scientific, Pittsburgh, Pa.) using a #9 wire wound bar. The coating was dried at 100° C. for 2 minutes resulting in a highly crosslinked silicate surface with submicron thickness.

The following Examples 1–2 illustrate the production of a color filter array using a photosensitive color element comprising a releasable carrier and a colored photoresist layer.

EXAMPLE 1

Preparation of red, green and blue photosensitive color elements:

The release layer coating solution described above was coated and dried on a 2 mil (0.051 mm) polyester carrier to achieve a dry coating weight of about 1 g/m². Each of the colored photoresist layer solutions listed in Table 1 were coated onto the release layer of separate polyester carders with a #5 wire wound bar and dried at room temperature.

| | Red Solution | Green Solution | Blue Solution |
|---|---|---|---|
| Blue Shade red pigment PR 179 dispersed in 50/50 VAGH (available from Penn Color Inc., Doylestown, PA) | 0.275 g | | |
| Blue shade green PG 7 pigment dispersed in 50/50 VAGH (available from Penn Color Inc., Doylestown, PA) | | 0.275 g | |
| Red Shade Blue PB 15:1 pigment dispersed in 50/50 VAGH (available from Penn Color Inc., Doylestown, PA) | | | 0.275 g |

-continued

| | Red Solution | Green Solution | Blue Solution |
|---|---|---|---|
| SR-295 (pentaerythritol tetraacrylate available from Sartomer Co., Westchester, PA) | 0.1375 g | 0.1375 g | 0.1375 g |
| Methacrylate photopolymerizable polymer (33% in MEK) | 0.1 g | 0.1 g | 0.1 g |
| p-Most-ol photoinitiator | 0.0125 g | 0.0125 g | 0.0125 g |
| Methyl ethyl ketone | 2.25 g | 2.25 g | 2.25 g |
| PMA | 0.413 g | 0.22 g | 0.413 g |
| PPMA | | 0.385 g | |
| Cyclohexanone | 0.413 g | 0.22 g | 0.413 g |

The coated side of the red photosensitive color element prepared above was placed in contact with the crosslinked silicated surface of the polyester receptor described above. The composite was then placed in a Berkey Ascor™ printing system and evacuated to remove the air between the surface contact interfaces for 30 seconds. The composite was then removed and laminated together in a laminator. The temporary polyester support was peeled off the surface leaving behind the release coating in contact with the photosensitive color layer on the receptor. The receptor with the color layer and release layer in contact was laminated a second time through the laminator. The adhesion of the photosensitive color layer to the receptor was tested by applying Scotch™ magic mending tape #81. Only the release layer could be removed with the mending tape.

A photomask representing the red image of the liquid crystal display (LCD) color filter was placed in intimate contact with the release surface of the laminate composite in a Berkey Ascor™ printing unit under vacuum. The composite was exposed for 80 seconds and then developed with a slightly alkaline aqueous developer. The image was wiped with ethanol and dried.

The same process described above was repeated with the blue and green photosensitive color elements such that all three colored images were generated on the receptor. The blue and green color layers were exposed using the corresponding blue and green photomasks. After completion of the process the red, green and blue images were present side-by-side in a single plane surface on the receptor. Some voids were observed in the image area; however, these voids were attributed to trapped dirt particles and some air entrapped due to the inefficiency of the vacuum unit in the Berkey Ascor™ printing unit.

EXAMPLE 2

The release layer coating solution described above was coated and dried on a 2 mil (0.051 mm) polyester carrier to achieve a dry coating weight of about 1 g/m². The following LCD color filter photoresist solutions (available from Hunt Electronic Technology Co., LTD, Tokyo, Japan) were coated onto the release surface using a #3 wire wound bar. The coatings were dried at 60° C. for 2 minutes.

Red: Mosaic™ CRY-SO89 C.I. Pigment Red 177, C.I. Pigment Yellow 139, benzyl methacrylate-methacrylic acid copolymer and dipentaerythritol hexaacrylate monomer in a mixture ethyl-3-ethoxypropionate, methoxypropylacetate and cyclohexanone solvents.

Blue: Mosaic™ CBV-SO105 C.I. Pigment Blue 15:6, C.I. Pigment Violet 23, benzyl methacrylate-methacrylic acid copolymer, and dipentaerythritol hexaacrylate monomer in a mixture of ethyl-3-ethoxypropionate, methoxypropylacetate and cyclohexanone solvents.

The red photosensitive color elements were laminated onto the silicated surface of a glass receptor described above and onto an uncoated glass receptor. Neither the coated nor uncoated glass receptors provided acceptable laminations with the red color element.

The blue photosensitive color element was laminated onto the silicated surface of a glass receptor. The temporary support was removed leaving the release coating and blue photoresist on the receptor. The laminate composite was then laminated a second time without the temporary support attached. The composite was exposed through a blue LCD photomask in a Berkey Ascor™ printing unit with UV radiation for 40 seconds. The composite was then developed with an aqueous Color Mosaic CD-2000 developer (tetramethyl ammonium hydroxide and diethanol amine in water, available from OCG Microelectronics Materials, Inc., West Peterson, N.J.). Approximately a third of the blue image was lost in the development process indicating poor adhesion of the exposed image to the glass receptor.

EXAMPLE 3

The red and blue color elements prepared in Example 2 were overcoated with an adhesive solution containing 10% by weight of 100 parts NeoRad™ NR-440 urethane-acrylate oligomer (available from Zeneca Resins, Wilmington, Mass.) and 2 parts Durocur™ 1173 photoinitiator (2-hydroxy-2-methyl-1-phenyl-1-propanone, available from Ciba-Geigy Corporation, Hawthorne, N.Y.) in water at a pH of about 8.5 using a #3 wire wound bar and dried at 60° C. for 2 minutes.

The red photosensitive element was laminated to the silicated surface of a glass receptor. The temporary support was removed and the composite laminated a second time. The composite was then exposed through a red LCD photomask in a Berkey Ascor™ printing unit at 40 seconds and developed with the Color Mosaic CD-2000 developer removing both the unexposed color layer and unexposed adhesive layer. The developed image was rinsed with deionized water and dried. When viewed with a 100×microscope, the colored image containing both a color layer and adhesive layer was sharp and uniform.

A blue image was then formed on the same glass receptor by laminating the blue photosensitive element to the surface of the glass receptor containing the red image. The temporary support was removed and the composite laminated a second time without the temporary support attached. The composite was exposed through a blue LCD photomask in a Berkey Ascor™ printing unit at 40 seconds and developed with the Color Mosaic CD-2000 developer removing both the unexposed color layer and unexposed adhesive layer. The developed image was rinsed with deionized water and dried. The resulting blue image containing both a color layer and adhesive layer was very good. The blue image adhered very well to the glass receptor without suffering from the effect of the red relief image. The blue and red images were in the same plane on the surface of the receptor. When viewed with a microscope the red and blue line images had sharp line edge definitions.

What is claimed is:

1. A method for making a color filter array having multiple colored images in a single plane comprising the steps of:

(i) providing a receptor comprising a transparent substrate having a top surface and a bottom surface, said top surface having deposited thereon a microporous crosslinked silicated coating, and a plurality of laminable photosensitive color elements having different colors, comprising, in order;
  (a) a temporary releasable support,
  (b) a colored photoresist layer, and
  (c) an optional photo-imageable adhesive layer;
(ii) laminating one of said photosensitive color elements onto said microporous coating to form a laminate structure;
(iii) removing said temporary support from said laminate structure;
(iv) exposing said colored photoresist layer and said optional photo-imageable adhesive layer in an imagewise pattern;
(v) removing non-exposed areas of said colored photoresist and non-exposed areas of said optional photo-imageable adhesive layer with a developer solution to form an image;
(vi) repeating steps (ii), (iii), (iv) and (v) with another one of said laminable photosensitive color elements having a different color until all of said multiple colored images are formed on said receptor; and
(vii) applying heat and pressure to said laminate structure a second time after step (iii) and before step (iv).

2. The method of claim 1 further comprising the step of associating said bottom surface of said transparent substrate with a liquid crystal display device.

3. The method of claim 1 wherein said temporary releaseable support comprising a support and a releasable coating deposited thereon.

4. A method for making a color filter array having colored images in a single plane formed within a black matrix comprising the steps of:
(i) providing a receptor comprising a transparent substrate having a top surface and a bottom surface, said top surface having deposited thereon a black matrix image and an optional microporous hydrophilic crosslinked silicated coating interposed between said substrate and said black matrix image, and a plurality of laminable photosensitive color elements having different colors, comprising, in order;
  (a) a temporary releasable support,
  (b) a colored photoresist layer, and
  (c) an optional photo-imageable adhesive layer;
(ii) laminating one of said photosensitive color elements onto said top surface of said receptor having said black matrix image deposited thereon to form a laminate structure;
(iii) removing said temporary support from said laminate structure;
(iv) exposing said colored photoresist layer and said optional photo-imageable adhesive layer in an imagewise pattern;
(v) removing non-exposed areas of said colored photoresist and non-exposed areas of said optional photo-imageable adhesive layer with a developer solution to form an image;
(vi) repeating steps (ii), (iii), (iv) and (v) with another one of said laminable photosensitive color elements having a different color until all of said multiple colored images are formed on said receptor; and
(vii) applying heat and pressure to said laminate structure a second time after step (iii) and before step (iv).

5. The method of claim 4 further comprising a step of associating said bottom surface of said transparent substrate with a liquid crystal display device.

6. The method of claim 4 wherein said temporary releaseable support comprising a support and a releasable coating deposited thereon.

7. A method for making a color filter array having multiple colored images in a single plane comprising the steps of:
(i) providing a receptor comprising a transparent substrate having a top surface and a bottom surface, said top surface having deposited thereon a microporous crosslinked silicated coating, and a plurality of laminable photosensitive color elements having different colors, comprising, in order,
  (a) a temporary transparent support,
  (b) a releasable layer,
  (c) a colored photoresist layer, and
  (d) a photo-imageable adhesive layer;
(ii) laminating one of said photosensitive color elements onto said microporous coating to form a laminate structure;
(iii) removing said temporary support from said laminate structure;
(iv) applying heat and pressure to said laminate structure a second time without said temporary support attached;
(v) exposing said colored photoresist layer and said photo-imageable adhesive layer in an imagewise pattern;
(vi) removing non-exposed areas of said colored photoresist and non-exposed areas of said photo-imageable adhesive layer with a developer solution to form an image;
(vi) repeating steps (ii), (iii), (iv), (v) and (vi) with another one of said laminable photosensitive color elements having a different color until all of said multiple colored images are formed on said receptor.

* * * * *